(12) United States Patent
Xu et al.

(10) Patent No.: US 11,114,465 B1
(45) Date of Patent: Sep. 7, 2021

(54) MEMORY DEVICE, SEMICONDUCTOR DEVICE AND ASSOCIATED METHOD

(71) Applicant: TAIWAN SEMICONDUCTOR MANUFACTURING COMPANY LTD., Hsinchu (TW)

(72) Inventors: Nuo Xu, Milpitas, CA (US); Zhiqiang Wu, Hsinchu County (TW)

(73) Assignee: TAIWAN SEMICONDUCTOR MANUFACTURING COMPANY LTD., Hsinchu (TW)

(*) Notice: Subject to any disclaimer, the term of this patent is extended or adjusted under 35 U.S.C. 154(b) by 0 days.

(21) Appl. No.: 16/925,291

(22) Filed: Jul. 9, 2020

(51) Int. Cl.
| | |
|---|---|
| *G11C 11/22* | (2006.01) |
| *H01L 27/1159* | (2017.01) |
| *H01L 29/78* | (2006.01) |
| *H01L 29/66* | (2006.01) |

(52) U.S. Cl.
CPC ........ *H01L 27/1159* (2013.01); *G11C 11/223* (2013.01); *G11C 11/2273* (2013.01); *G11C 11/2275* (2013.01); *H01L 29/6684* (2013.01); *H01L 29/78391* (2014.09)

(58) Field of Classification Search
CPC .......... H01L 27/1159; H01L 29/78391; H01L 29/6684; G11C 11/223; G11C 11/2273; G11C 11/2275
USPC ....................................................... 365/145
See application file for complete search history.

(56) References Cited

U.S. PATENT DOCUMENTS

| | | | | |
|---|---|---|---|---|
| 2003/0086285 A1* | 5/2003 | Yamaguchi | ............. | G11C 11/22 365/145 |
| 2003/0235067 A1* | 12/2003 | Sakai | ...................... | G11C 11/22 365/145 |
| 2005/0094457 A1* | 5/2005 | Chen | ................. | H01L 29/78391 365/222 |
| 2008/0023741 A1* | 1/2008 | Kang | ................... | H01L 29/6684 257/295 |
| 2008/0025065 A1* | 1/2008 | Kim | ........................ | G11C 11/22 365/145 |
| 2009/0173978 A1* | 7/2009 | Kato | .................... | H01L 27/1159 257/295 |
| 2009/0290404 A1* | 11/2009 | Kaneko | ............. | H01L 29/78391 365/145 |
| 2010/0039850 A1* | 2/2010 | Kitazaki | ................. | H01L 28/55 365/145 |

(Continued)

*Primary Examiner* — Viet Q Nguyen
(74) *Attorney, Agent, or Firm* — WPAT, P.C.; Anthony King

(57) ABSTRACT

A memory device, including: memory cells, first conductive lines, second conductive lines, third conductive lines and fourth conductive lines. The memory cells are arranged in an array. Each memory cell includes a transistor and a capacitor connected to a gate terminal of the transistor in series. The first conductive lines extend in a first direction. Each first conductive line connects to gate terminals of transistors arranged in same column in the array. The second conductive lines extend in the first direction. Each second conductive line connects to source terminals of transistors arranged in same column in the array. The third conductive lines extend in the first direction. Each third conductive line connects to drain terminals of transistors arranged in same column in the array. The fourth conductive lines extend in a second direction. Each fourth conductive line couples to the capacitor arranged in same row in the array.

20 Claims, 7 Drawing Sheets

(56) References Cited

U.S. PATENT DOCUMENTS

| | | | |
|---|---|---|---|
| 2011/0255328 A1* | 10/2011 | Murakuki | H01L 27/11509 |
| | | | 365/145 |
| 2011/0299318 A1* | 12/2011 | Kaneko | H01L 29/516 |
| | | | 365/145 |
| 2015/0070964 A1* | 3/2015 | Yamada | H01L 21/84 |
| | | | 365/145 |
| 2018/0331113 A1* | 11/2018 | Liao | H01L 28/40 |
| 2018/0366174 A1* | 12/2018 | Liu | G11C 11/221 |
| 2019/0273087 A1* | 9/2019 | Morris | G11C 11/223 |
| 2020/0075609 A1* | 3/2020 | Morris | G11C 11/2273 |

* cited by examiner

MEMORY DEVICE, SEMICONDUCTOR DEVICE AND ASSOCIATED METHOD

BACKGROUND

For advanced technology nodes, the supply voltage applied to the integrated circuit is low (e.g., 0.75 Volts-1.2 Volts). However, for a ferroelectric field effect transistor (FeFET) based memory cell, the low supply voltage reduces the polarization charge, and further reduces the memory window. Therefore, the FeFET based memory cell suffers from the high performance variability.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
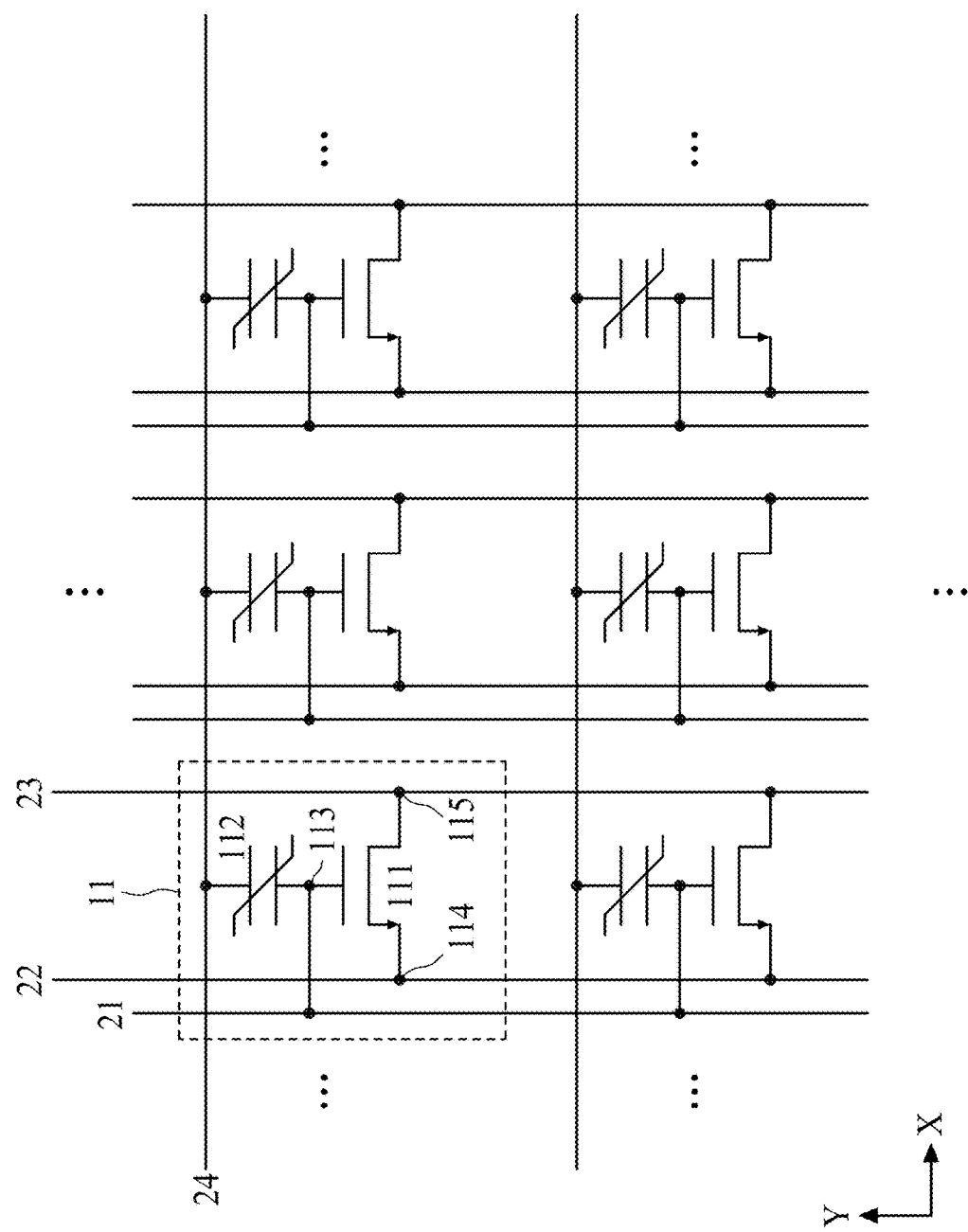
FIG. 1 is a diagram illustrating a memory device in accordance with an embodiment of the present disclosure.

The following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in the respective testing measurements. Also, as used herein, the term "about" generally means within 10%, 5%, 1%, or 0.5% of a given value or range. Alternatively, the term "about" means within an acceptable standard error of the mean when considered by one of ordinary skill in the art. Other than in the operating/working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the term "about." Accordingly, unless indicated to the contrary, the numerical parameters set forth in the present disclosure and attached claims are approximations that can vary as desired. At the very least, each numerical parameter should at least be construed in light of the number of reported significant digits and by applying ordinary rounding techniques. Ranges can be expressed herein as from one endpoint to another endpoint or between two endpoints. All ranges disclosed herein are inclusive of the endpoints, unless specified otherwise.

FIG. 1 is a diagram illustrating a memory device 10 in accordance with an embodiment of the present disclosure. The memory device 10 includes a plurality of memory cells 11 arranged in an array. In this embodiment, the memory cell 11 is a ferroelectric field effect transistor (FeFET) based memory cell. The memory cell 11 includes a transistor 111 and a ferroelectric capacitor (FeCAP) 112, wherein the FeCAP 112 is connected to a gate terminal 113 of the transistor 111 in series.

The memory device 10 further includes a plurality of first conductive lines 21 extending in a first direction (i.e., y direction), wherein each first conductive line 21 connects to the gate terminals 113 of transistors 111 arranged in same column in the array. The memory device 10 further includes a plurality of second conductive lines 22 extending in the first direction (i.e., y direction), wherein each second conductive line 22 connects to source terminals 114 of transistors 111 arranged in same column in the array.

The memory device 10 further includes a plurality of third conductive lines 23 extending in the first direction (i.e., y direction), wherein each third conductive line 23 connects to drain terminals 115 of transistors 111 arranged in same column in the array. In addition, the memory device 10 further includes a plurality of fourth conductive lines 24 extending in a second direction (i.e., x direction), wherein each fourth conductive line 24 couples to FeCAPs 112 arranged in same row in the array.

Those skilled in the art should understand that the second conductive line 22 can be considered as a source line in a memory device, the third conductive line 23 can be considered as a bit line in a memory device, and the fourth conductive line 24 can be considered as a word line in a memory device.

Figure 2:
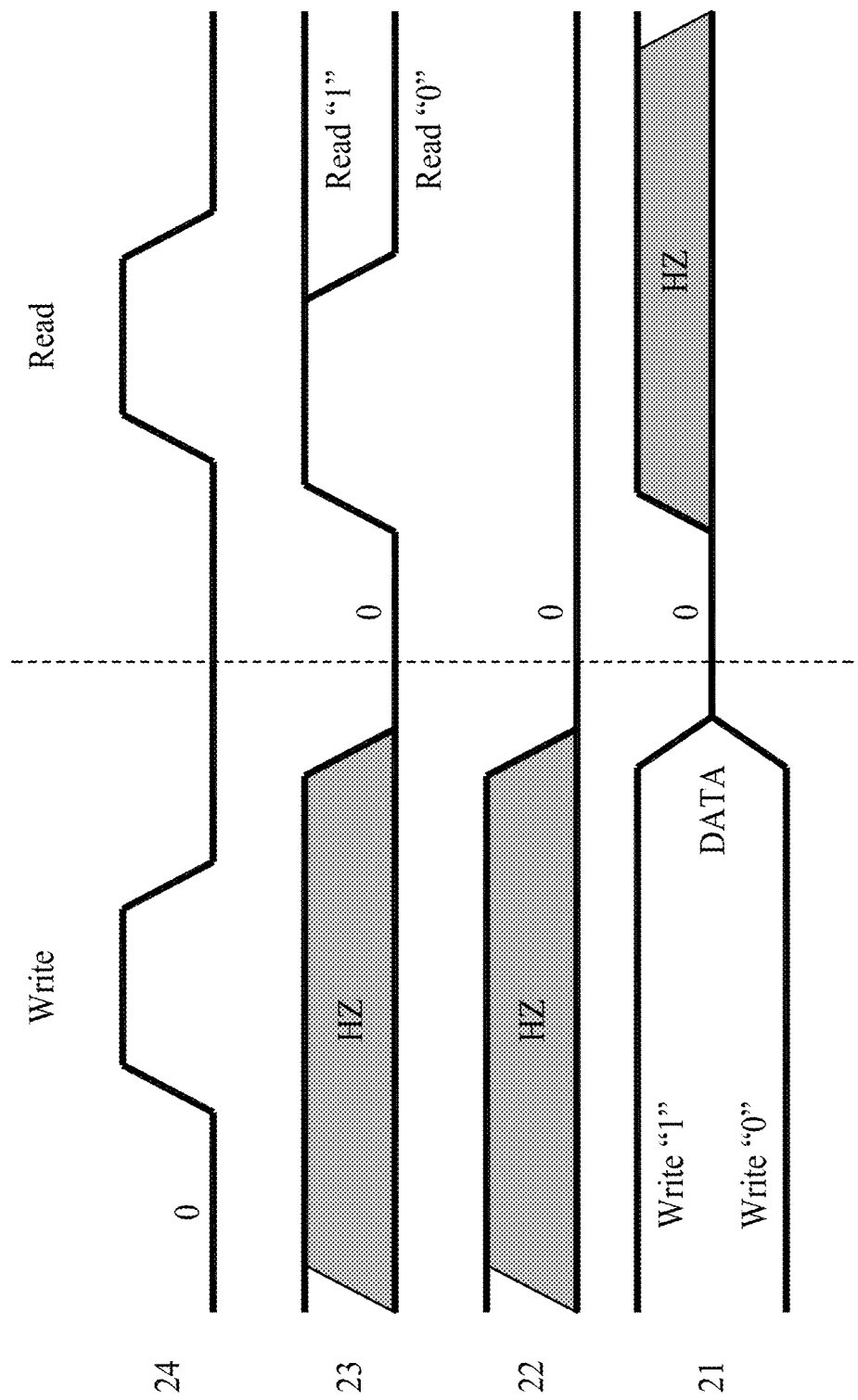
FIG. 2 is a diagram illustrating an access operation of a memory device in accordance with an embodiment of the present disclosure.

Refer to FIG. 2 in conjunction with FIG. 1, wherein FIG. 2 is a diagram illustrating an access operation of the memory device 10 in accordance with an embodiment of the present disclosure. Take the memory cell 11 at the top left corner in FIG. 1 for example, when the memory device 10 executes a write operation upon the memory cell 11 at the top left corner, the corresponding first conductive line 21 for the memory cell 11 at the top left corner is directed to a data to be written in the memory cell 11 at the top left corner.

Moreover, the corresponding second conductive line 22 and the corresponding third conductive line 23 for the memory cell 11 at the top left corner are floating. That is, the corresponding second conductive line 22 and the corresponding third conductive line 23 for the memory cell 11 at the top left corner are free from connecting to any signal. Furthermore, the corresponding fourth conductive line 24 for the memory cell 1 at the top left corner is directed to an indicating voltage, wherein the indicating voltage indicates that the memory cell 11 at the top left corner is selected.

Specifically, when the data to be written into the memory cell 11 at the top left corner is a logic value '1', a high voltage is directed to the corresponding first conductive line 21 for the memory cell 11 at the top left corner. On the other hand, when the data to be written into the memory cell 11 at the top left corner is a logic value '0', a low voltage is directed to the corresponding first conductive line 21 for the memory cell 11 at the top left corner.

In some embodiments of the present disclosure, the high voltage directed to the corresponding first conductive line 21 for the memory cell 11 ranges from 4.5 volts to 7.5 volts. In some embodiments of the present disclosure, the low voltage directed to the corresponding first conductive line 21 for the memory cell 11 ranges from −1.5 volts to −4.5 volts. In some embodiments of the present disclosure, the indicating voltage ranges from 0.75 volts to 1.5 volts.

When the memory device 10 executes a read operation upon the memory cell 11 at the top left corner, the corresponding first conductive line 21 for the memory cell 11 at the top left corner is floating. That is, the corresponding first conductive line 21 for the memory cell 11 at the top left corner is free from connecting to any signal.

Moreover, the corresponding second conductive line 22 for the memory cell 11 at the top left corner is directed to a ground voltage (i.e., 0 Volt). Furthermore, the corresponding third conductive line 23 for the memory cell 11 at the top left corner is directed to the data written into the memory cell 11 at the top left corner in the write operation. In this embodiment, the corresponding third conductive line 23 for the memory cell 11 at the top left corner pre-charges before reading the data. In addition, the corresponding fourth conductive line 24 for the memory cell 11 at the top left corner is directed to the indicating voltage, wherein the indicating voltage indicates that the memory cell 11 at the top left corner is selected.

Specifically, when the data written into the memory cell 11 at the top left corner is a logic value '1', a high voltage is directed to the corresponding third conductive line 23 for the memory cell 11 at the top left corner. On the other hand, when the data written into the memory cell 11 at the top left corner is a logic value '0', a low voltage is directed to the corresponding third conductive line 23 for the memory cell 11 at the top left corner.

In some embodiments of the present disclosure, the high voltage directed to the corresponding third conductive line 23 for the memory cell 11 at the top left corner is ranged from 0.75 volts to 1.5 volts. In some embodiments of the present disclosure, the low voltage directed to the corresponding third conductive line 23 for the memory cell 11 at the top left corner is 0 volt.

In the present disclosure, the indicating voltage on the corresponding fourth conductive line 24 is smaller than three times a threshold voltage of the transistor 111 of the memory cell 11. With such configurations, the sneak-path effect of the memory device 10 can be effectively suppressed, and the switching non-linearity of the memory cell 11 can be mitigated.

However, in some embodiments of the present disclosure, another configuration is adopted to suppress the sneak-path effect and mitigate the switching non-linearity.

Figure 3:
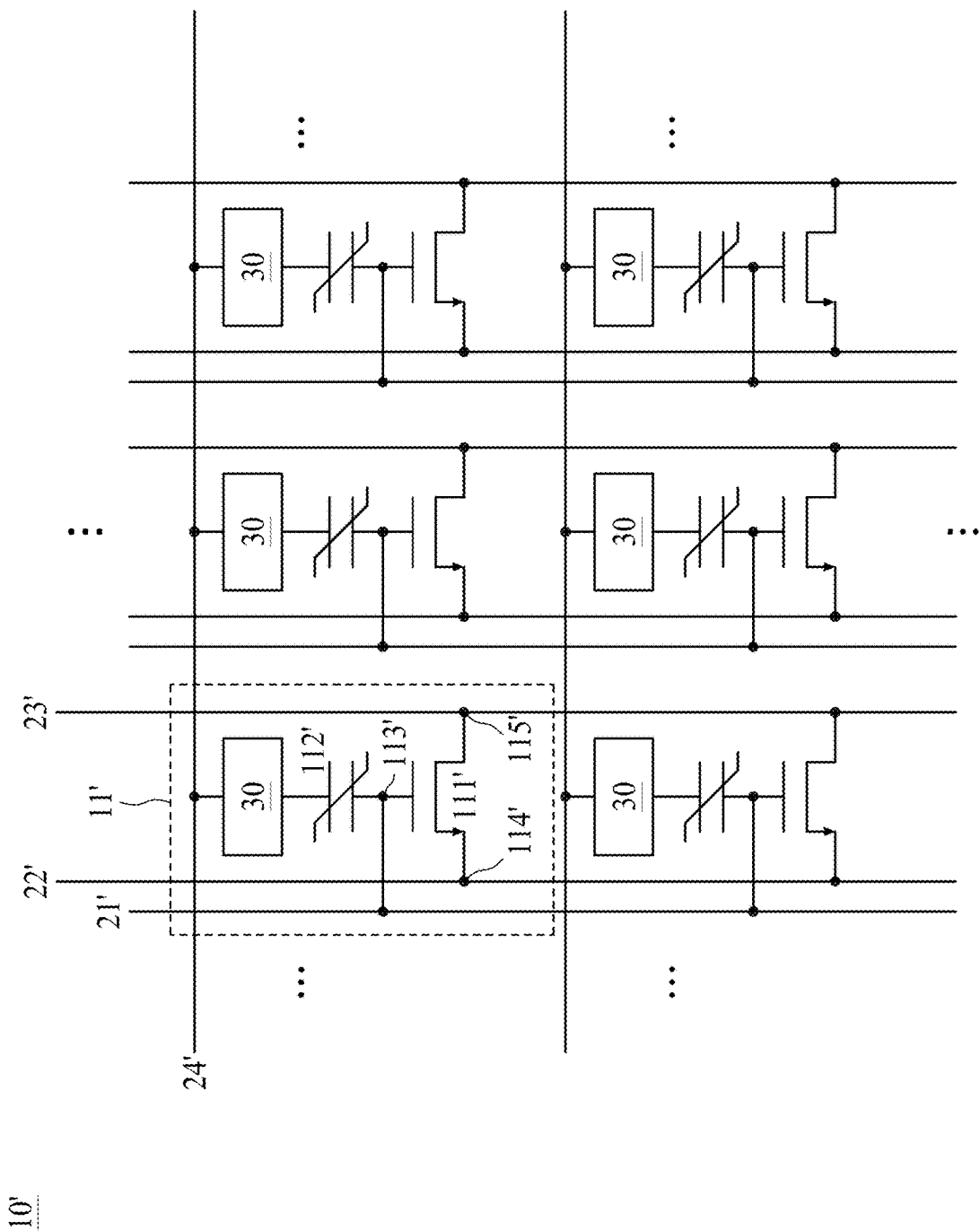
FIG. 3 is a diagram illustrating a memory device in accordance with another embodiment of the present disclosure.

FIG. 3 is a diagram illustrating a memory device 10' in accordance with an embodiment of the present disclosure. The memory device 10' includes a plurality of memory cells 11' arranged in an array. In this embodiment, the memory cell 11' is a FeFET based memory cell. The memory cell 11' includes a transistor 111', a FeCAP 112' and a mitigating device 30, wherein one terminal of the FeCAP 112' is connected to a gate terminal 113' of the transistor 111' in series and the other terminal of the FeCAP 112' is connected to the mitigating device 30.

The memory device 10' further includes a plurality of first conductive lines 21' extending in the first direction (i.e., y direction), wherein each first conductive line 21' connects to the gate terminals 113' of transistors 111' arranged in same column in the array. Moreover, the memory device 10' further includes a plurality of second conductive lines 22' extending in the first direction (i.e., y direction), wherein each second conductive line 22' connects to source terminals 114' of transistors 111/' arranged in same column in the array.

Furthermore, the memory device 10' further includes a plurality of third conductive lines 23' extending in the first direction (i.e., y direction), wherein each third conductive line 23' connects to drain terminals 115' of transistors 111' arranged in same column in the array. In addition, the memory device 10' further includes a plurality of fourth conductive lines 24' extending in the second direction (i.e., x direction), wherein each fourth conductive line 24' couples to FeCAPs 112' arranged in same row in the array.

Those skilled in the art should understand that the second conductive line 22' can be considered as a source line in a memory device, the third conductive line 23' can be considered as a bit line in a memory device, and the fourth conductive line 24' can be considered as a word line in a memory device.

In some embodiments of the present disclosure, the mitigating device 30 connected between the corresponding fourth line 24' and the FeCAP 112' includes a Shottky diode. In some embodiments of the present disclosure, the mitigating device 30 includes a tunnel diode. In some embodiments of the present disclosure, the mitigating device 30 includes a Metal-Insulator-Metal (MIM) capacitor. With the mitigating device 30, the sneak-path effect of the memory device 10 can be effectively suppressed, and the switching non-linearity of the memory cell 11 can be mitigated.

The access operation of the memory device 10' is similar to the access operation of the memory device 10 mentioned in the embodiment of FIG. 2, the detailed description of the access operation of the memory device 10' is omitted here for brevity.

Figure 4:
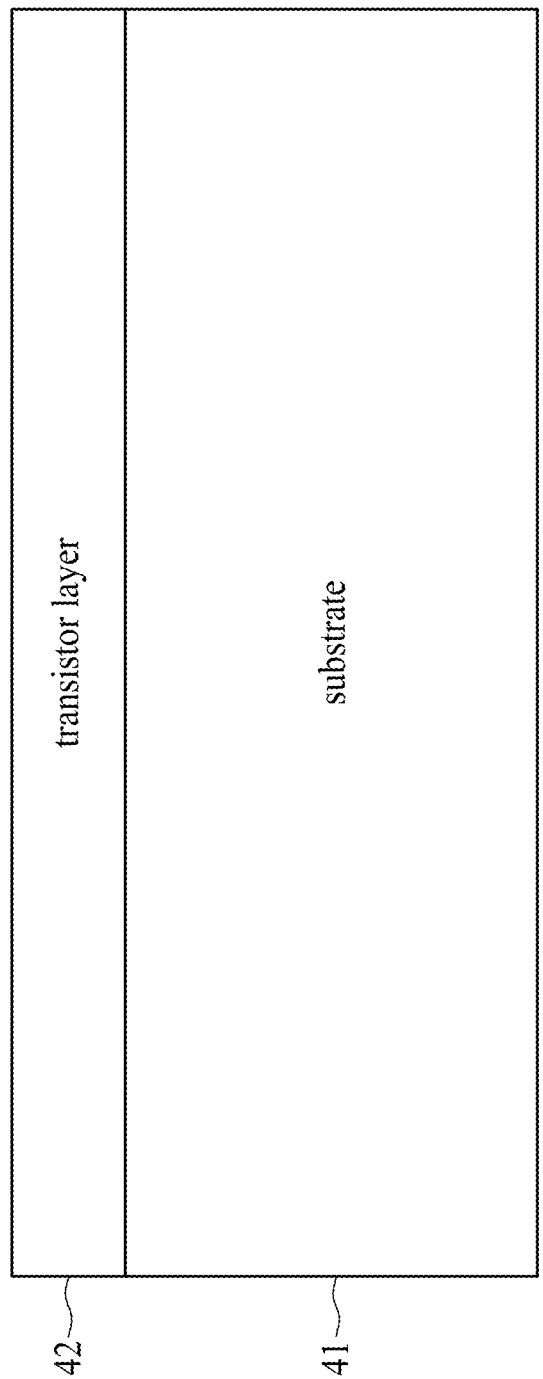
FIG. 4 is a diagram illustrating a semiconductor device in accordance with an embodiment of the present disclosure.

FIG. 4 is a diagram illustrating a semiconductor device 4 in accordance with an embodiment of the present disclosure. In some embodiments of the present disclosure, the semiconductor device 4 can be implemented by the memory device 1 in the embodiment of FIG. 1. The semiconductor device 4 includes a substrate 41 and a transistor layer 42. The substrate 41 may include a semiconductor substrate. In some embodiments of the present disclosure, the material of the substrate 41 may include elementary semiconductor such as silicon or germanium; a compound semiconductor such as silicon germanium, silicon carbide, gallium arsenic, gallium phosphide, indium phosphide or indium arsenide; or combinations thereof.

In some embodiments of the present disclosure, semiconductor components such as transistor components, electronic components such as resistor components, capacitor components, or inductor components, and circuit layers may be formed in or over the substrate 41.

The transistor layer 42 formed on the substrate 41 includes transistor components. In some embodiments of the present disclosure, the transistor layer 42 includes the array of the memory cells 11 in the embodiment of FIG. 1.

Those skilled in the art should readily understand that there is a connection layer configured as a back-end-of-the-line (BEOL) layer on the transistor 42, wherein the connection layer includes multi-layers of inter-layer dielectric (ILD) layer, and each ILD layer surrounds signal lines for signal connection.

In some embodiments of the present disclosure, the material of the ILD layer may include dielectric material. In some embodiments of the present disclosure, the material of the signal lines for signal connection includes metal or alloy such as copper, tungsten, alloy thereof or the like.

Figure 5:
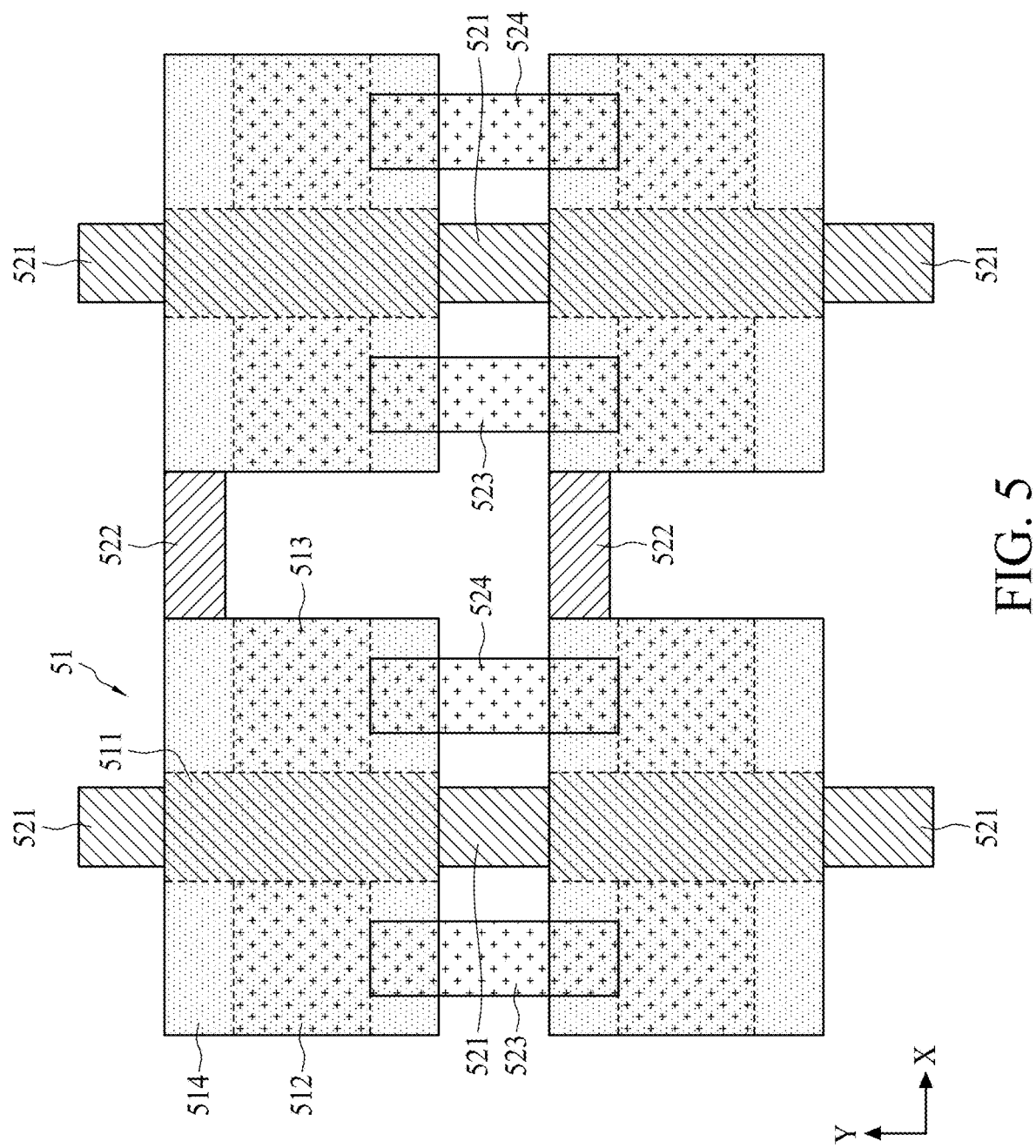
FIG. 5 is a diagram illustrating a transistor layer in accordance with an embodiment of the present disclosure.

FIG. 5 is a diagram illustrating a portion of the transistor layer 42 in accordance with an embodiment of the present disclosure. The transistor layer 42 includes a plurality of memory cell 421 arranged in an array. It should be noted that only a portion of the array is shown in FIG. 5 for brevity. In some embodiments of the present disclosure, the memory cell 51 can be implemented by the memory cell 11 in the embodiment of FIG. 1.

The memory cell 51 includes a gate strip 511 extending in the first direction (i.e., y direction), wherein the gate strip 511 is arranged to define a gate terminal of a transistor. The memory cell 51 further includes active regions 512 and 513, wherein the active regions 512 and 513 are arranged to define the source region and the drain region of the transistor, respectively. The memory cell 51 further includes a ferroelectric material strip 514 extending the second direction (i.e. x direction), wherein the ferroelectric material strip 514 is formed over the gate strip 511 and the active regions 512 and 513.

It should be noted that FIG. 5 is a top view diagram. Therefore, in practice, the gate strip 511 and the active regions 512 and 513 will not be seen from the top view because the ferroelectric material strip 514. However, the gate strip 511 and the active regions 512 and 513 are depicted in FIG. 5 for better understanding the detailed structure of the transistor layer 42.

Those skilled in the art should understand that the intersection of the gate strip 511 and the ferroelectric material strip 514 defines a FeFET. Therefore, the transistor layer 42 includes an array of the FeFETs.

The transistor layer 42 further includes conductive lines for signal connection. Specifically, the transistor layer 42 includes a plurality of first conductive lines 521 extending in the first direction (i.e. y direction), wherein each first conductive line 521 connects to the gate strips 511 of the FeFETs arranged in the same column in the array. The transistor layer 42 further includes a plurality of second conductive lines 522 extending in the second direction (i.e. x direction), wherein each second conductive line 522 connects to the ferroelectric material strips 512 of the FeFETs arranged in the same row in the array.

The transistor layer 42 further includes a plurality of third conductive lines 523 extending in the first direction (i.e. y direction), wherein each third conductive line 523 connects to the source regions of the FeFETs arranged in the same column in the array. The transistor layer 42 further includes a plurality of fourth conductive lines 524 extending in the first direction (i.e. y direction), wherein each fourth conductive line 524 connects to the drain regions of the FeFETs arranged in the same column in the array.

After reading the embodiment of FIG. 1, those skilled in the art should understand each of the plurality of second conductive lines 522 is configured to be a word line in a memory device, each of the plurality of third conductive lines 523 is configured to be a source line in a memory device, and each of the plurality of fourth conductive lines 524 is configured to be a bit line in a memory device.

Taking the memory cell at the top left corner in FIG. 5 for example, when the semiconductor device 4 executes a write operation upon the memory cell 51 at the top left corner, the corresponding first conductive line 521 for the memory cell 51 at the top left corner is directed to a data to be written in the memory cell 51 at the top left corner.

Moreover, the corresponding third conductive line 523 and the corresponding fourth conductive line 524 for the memory cell 51 at the top left corner are floating. That is, the corresponding third conductive line 523 and the corresponding fourth conductive line 524 for the memory cell 51 at the top left corner are free from connecting to any signal. Furthermore, the corresponding second conductive line 522 for the memory cell 51 at the top left corner is directed to an indicating voltage.

Specifically, when the data to be written into the memory cell 51 at the top left corner is a logic value '1', a high voltage is directed to the corresponding first conductive line 521 for the memory cell 51 at the top left corner. On the other hand, when the data to be written into the memory cell 51 at the top left corner is a logic value '0', a low voltage is directed to the corresponding first conductive line 521 for the memory cell 51 at the top left corner.

In some embodiments of the present disclosure, the high voltage directed to the corresponding first conductive line 521 for the memory cell 51 ranges from 4.5 volts to 7.5 volts. In some embodiments of the present disclosure, the low voltage directed to the corresponding first conductive line 521 for the memory cell 51 ranges from −1.5 volts to −4.5 volts. In some embodiments of the present disclosure, the indicating voltage ranges from 0.75 volts to 1.5 volts.

When the semiconductor device 4 executes a read operation upon the memory cell 51 at the top left corner, the corresponding first conductive line 521 for the memory cell 51 at the top left corner is floating. That is, the corresponding first conductive line 521 for the memory cell 51 at the top left corner is free from connecting to any signal.

Moreover, the corresponding third conductive line 523 for the memory cell 51 at the top left corner is directed to a ground voltage (e.g., 0 Volt). Furthermore, the corresponding fourth conductive line 524 for the memory cell 51 at the top left corner is directed to the data written into the memory cell 51 at the top left corner. The corresponding fourth conductive line 524 for the memory cell 51 at the top left corner pre-charges before reading the data. In addition, the corresponding second conductive line 522 for the memory cell 51 at the top left corner is directed to the indicating voltage.

Specifically, when the data written into the memory cell 51 at the top left corner in the write operation is a logic value '1', a high voltage is directed to the corresponding fourth conductive line 524 for the memory cell 51 at the top left corner. On the other hand, when the data written into the memory cell 51 at the top left corner in the write operation is a logic value '0', a low voltage is directed to the corresponding fourth conductive line 524 for the memory cell 51 at the top left corner.

In some embodiments of the present disclosure, the high voltage directed to the corresponding fourth conductive line 524 for the memory cell 51 at the top left corner ranges from 0.75 volts to 1.5 volts. In some embodiments of the present disclosure, the low voltage directed to the corresponding fourth conductive line 524 for the memory cell 51 at the top left corner is 0 volt.

In the present disclosure, the indicating voltage on the corresponding second conductive line 522 is smaller than three times a threshold voltage of the FeFET of the memory cell 51. With such configurations, the sneak-path effect of the semiconductor device 4 can be effectively suppressed, and the switching non-linearity of the memory cell 51 can be mitigated.

In the embodiment of FIG. 5, the plurality of first conductive lines 521 and the plurality of gate strips 511 are coplanar. That is, the plurality of first conductive lines 521 and the plurality of gate strips 511 are connected by direct contact. In the embodiment of FIG. 5, the plurality of second conductive lines 522 and the plurality of ferroelectric material strips 514 are coplanar. That is, the plurality of second conductive lines 522 and the plurality of ferroelectric material strips 514 are connected by direct contact.

In the embodiment of FIG. 5, the plurality of third conductive lines 523 and the plurality of source region 512 are coplanar. That is, the plurality of third conductive lines 523 and the plurality of source regions 512 are connected by direct contact. In the embodiment of FIG. 5, the plurality of fourth conductive lines 524 and the plurality of drain region 513 are coplanar. That is, the plurality of fourth conductive lines 524 and the plurality of drain regions 513 are connected by direct contact.

Figure 6:
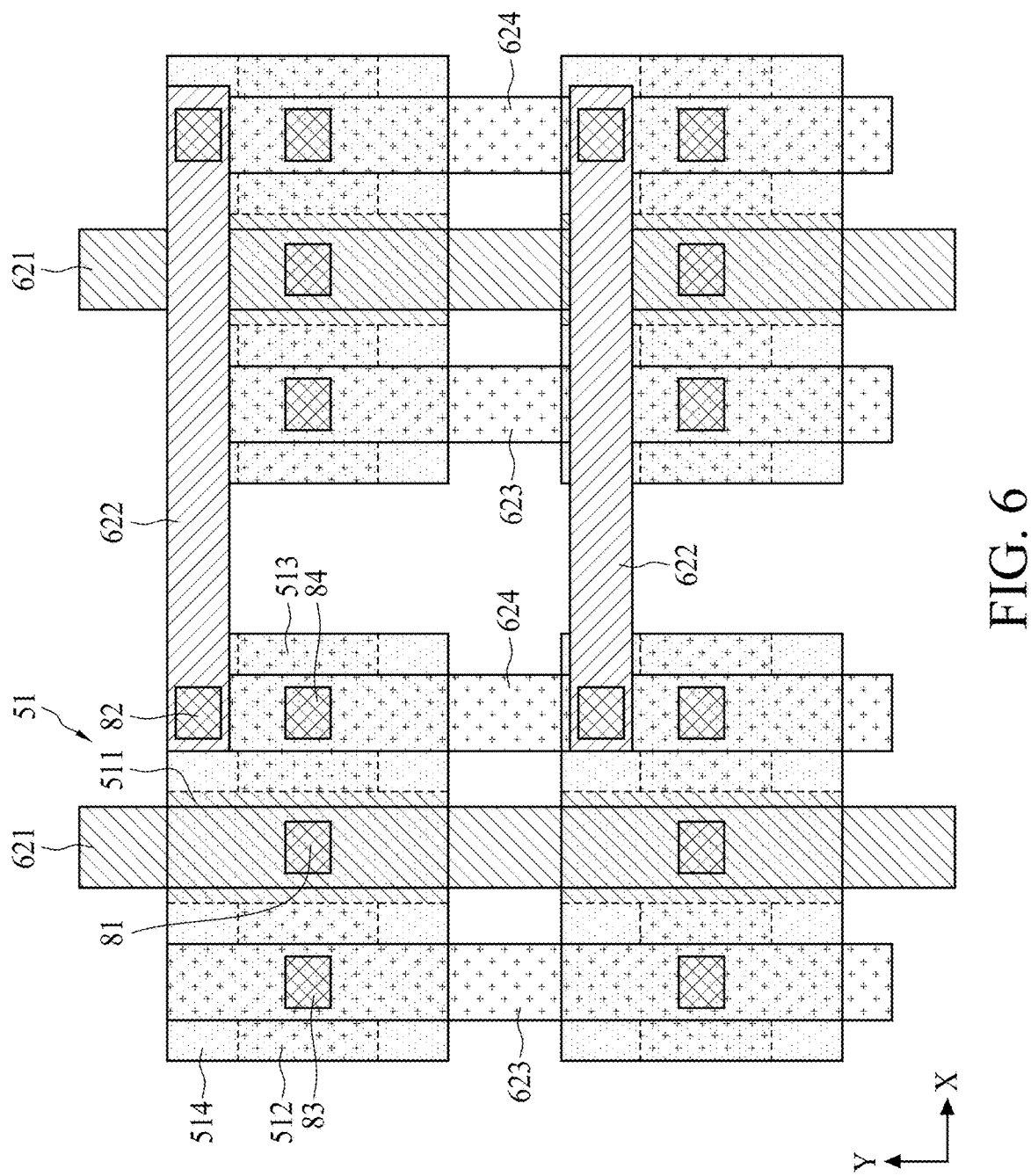
FIG. 6 is a diagram illustrating a transistor layer in accordance with another embodiment of the present disclosure.

FIG. 6 is a diagram illustrating a portion of the transistor layer 42 in accordance with another embodiment of the present disclosure. The transistor layer 42 shown in FIG. 6 is similar to the transistor layer 42 shown in FIG. 5 except the connections between memory cells 51. Specifically, in the embodiment of FIG. 6, the plurality of first conductive lines 621 are formed above the plurality of gate strips 511 and beneath the plurality of ferroelectric material strips 512. Therefore, the plurality of first conductive lines 621 and the plurality of gate strips 511 are connected by contact vias 81.

In the embodiment of FIG. 6, the plurality of second conductive lines 622 are formed above the plurality of ferroelectric material strips 514. Therefore, the plurality of second conductive lines 622 and the plurality of ferroelectric material strips 514 are connected by contact vias 82.

In the embodiment of FIG. 6, the plurality of third conductive lines 623 are formed above the plurality of source regions 512. Therefore, the plurality of third conductive lines 623 and the plurality of source regions 512 are connected by contact vias 83. In the embodiment of FIG. 6, the plurality of fourth conductive lines 624 are formed above the plurality of drain regions 513. Therefore, the plurality of fourth conductive lines 624 and the plurality of drain regions 513 are connected by contact vias 84.

As mentioned in the embodiment of FIG. 5, the ferroelectric material strips 514 are formed above the gate strips 511 and the active regions 512 and 513. Therefore, in practice, the gate strips 511, the active regions 512 and 513 and the contact vias 81, 83, 84 will not be seen from top view because the ferroelectric material strips 514. The gate strips 511, the active regions 512 and 513 and the contact vias 81, 83, 84 are depicted for better understanding the detailed structure of the transistor layer 42.

Taking the memory cell 51 at the top left corner for example, when the semiconductor device 4 executes a write operation upon the memory cell 51 at the top left corner, the corresponding first conductive line 621 for the memory cell 51 at the top left corner is directed to a data to be written in the memory cell 51 at the top left corner.

Moreover, the corresponding third conductive line 623 and the corresponding fourth conductive line 624 for the memory cell 51 at the top left corner are floating. That is, the corresponding third conductive line 623 and the corresponding fourth conductive line 624 for the memory cell 51 at the top left corner are free from connecting to any signal. Furthermore, the corresponding second conductive line 622 for the memory cell 51 at the top left corner is directed to an indicating voltage.

Specifically, when the data to be written into the memory cell 51 at the top left corner is a logic value '1', a high voltage is directed to the corresponding first conductive line 621 for the memory cell 51 at the top left corner. On the other hand, when the data to be written into the memory cell 51 at the top left corner is a logic value '0', a low voltage is directed to the corresponding first conductive line 621 for the memory cell 51 at the top left corner.

In some embodiments of the present disclosure, the high voltage directed to the corresponding first conductive line 621 for the memory cell 51 ranges from 4.5 volts to 7.5 volts. In some embodiments of the present disclosure, the low voltage directed to the corresponding first conductive line 621 for the memory cell 51 ranges from −1.5 volts to −4.5 volts. In some embodiments of the present disclosure, the indicating voltage ranges from 0.75 volts to 1.5 volts.

When the semiconductor device 4 executes a read operation upon the memory cell 51 at the top left corner, the corresponding first conductive line 621 for the memory cell 51 at the top left corner is floating. That is, the corresponding first conductive line 621 for the memory cell 51 at the top left corner is free from connecting to any signal.

Moreover, the corresponding third conductive line 623 for the memory cell 51 at the top left corner is directed to a ground voltage (e.g., 0 Volt). Furthermore, the corresponding fourth conductive line 624 for the memory cell 51 at the top left corner is directed to the data written into the memory cell 51 at the top left corner in the write operation. The corresponding fourth conductive line 624 for the memory cell 51 at the top left corner pre-charges before reading the data. In addition, the corresponding second conductive line 622 for the memory cell 51 at the top left corner is directed to the indicating voltage.

Specifically, when the data written into the memory cell 51 at the top left corner in the write operation is a logic value '1', a high voltage is directed to the corresponding fourth conductive line 624 for the memory cell 51 at the top left corner. On the other hand, when the data written into the memory cell 51 at the top left corner in the write operation is a logic value '0', a low voltage is directed to the corresponding fourth conductive line 624 for the memory cell 51 at the top left corner.

In some embodiments of the present disclosure, the high voltage directed to the corresponding fourth conductive line 624 for the memory cell 51 at the top left corner ranges from 0.75 volts to 1.5 volts. In some embodiments of the present disclosure, the low voltage directed to the corresponding fourth conductive line 624 for the memory cell 51 at the top left corner is 0 volt.

In the present disclosure, the indicating voltage on the corresponding second conductive line 622 is smaller than three times a threshold voltage of the FeFET of the memory cell 51. With such configurations, the sneak-path effect of the semiconductor device 4 can be effectively suppressed, and the switching non-linearity of the memory cell 51 can be mitigated.

Figure 7:
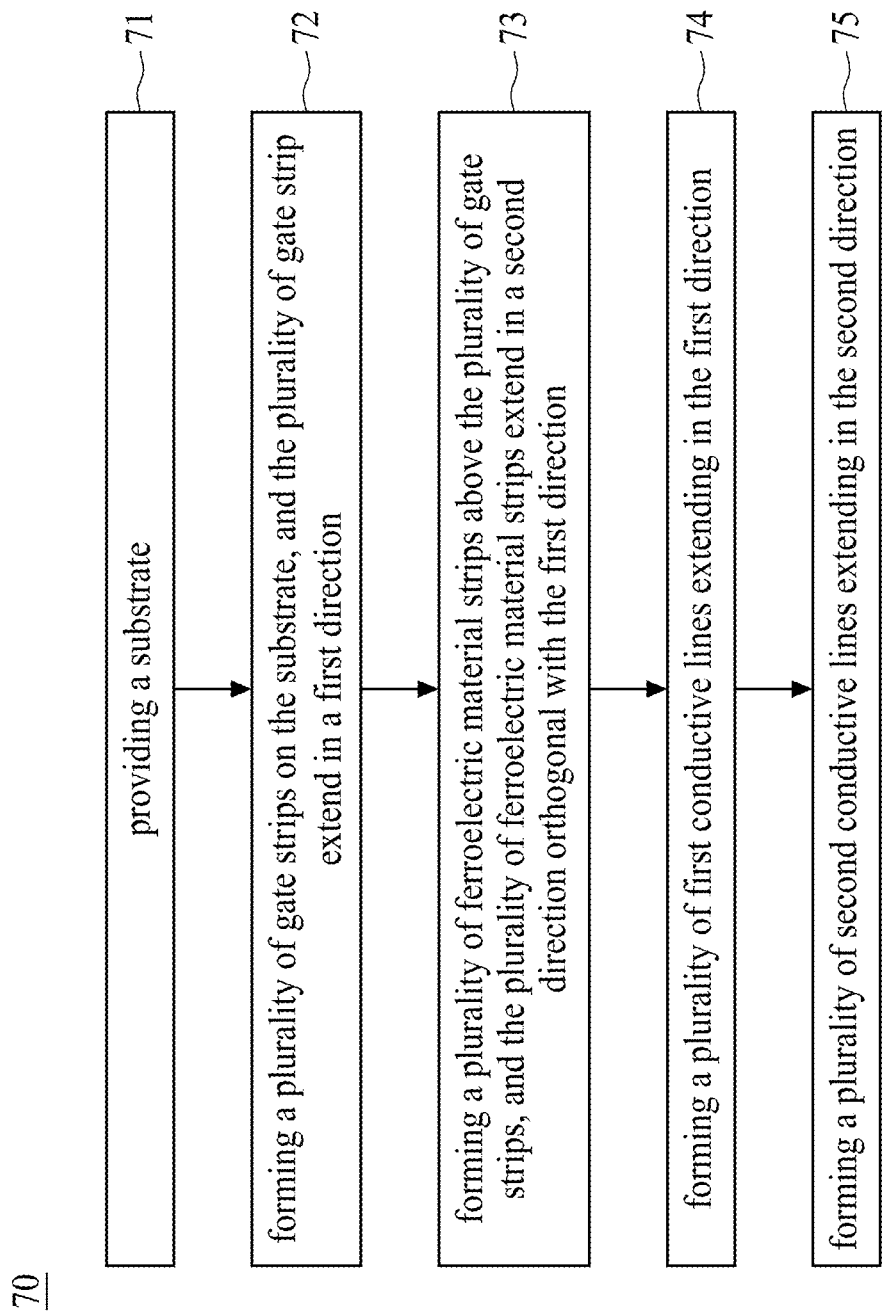
FIG. 7 is a flowchart illustrating a method of manufacturing a semiconductor device in accordance with another embodiment of the present disclosure.

FIG. 7 is a flowchart illustrating a method 70 of manufacturing a semiconductor device in accordance with an embodiment of the present disclosure. Provided that the results are substantially the same, the operations shown in FIG. 7 are not required to be executed in the exact order. The method 70 is summarized as follows.

In Operation 71, a substrate is provided. For example, the substrate can be the substrate 41 mentioned in the embodiment of FIG. 4. For example, the material of the substrate may include elementary semiconductor such as silicon or germanium; a compound semiconductor such as silicon germanium, silicon carbide, gallium arsenic, gallium phosphide, indium phosphide or indium arsenide; or combinations thereof.

In Operation 72, a plurality of gate strips are formed on the substrate, and the plurality of gate strips extend in a first direction. For example, the plurality of gate strips can be the gate strips 511 mentioned in the embodiments of FIGS. 5 and 6.

In Operation 73, a plurality of ferroelectric material strips are formed above the plurality of gate strips, and the plurality of ferroelectric material strips extend in a second direction orthogonal with the first direction, wherein intersections of the gate strips and the ferroelectric material strips define an array of FeFET. For example, the plurality of ferroelectric material strips can be the ferroelectric material strips 514 mentioned in the embodiments of FIGS. 5 and 6.

In Operation 74, a plurality of first conductive lines are formed, and the plurality of first conductive lines extend in the first direction, wherein each first conductive line connects to one of the plurality of gate strips. For example, the plurality of first conductive lines can be the plurality of first conductive lines 521 and 621 mentioned in the embodiments of FIGS. 5 and 6.

In Operation 75, a plurality of second conductive lines are formed, and the plurality of second conductive lines extend in the second direction, wherein each second conductive line connects to one of the plurality of ferroelectric material strips. For example, the plurality of second conductive lines can be the plurality of second conductive lines 522 and 622 mentioned in the embodiments of FIGS. 5 and 6.

Those skilled in the art should readily understand the operations of the method 70 after reading the embodiments mentioned above, the details of the method 70 is omitted here for brevity.

In some embodiments, a memory device is disclosed. The memory device includes a plurality of memory cells, a plurality of first conductive lines, a plurality of second conductive lines, a plurality of third conductive lines and a plurality of fourth conductive lines. The plurality of memory cells arranged in an array, wherein each memory cell includes a transistor and a capacitor connected to a gate terminal of the transistor in series. The plurality of first conductive lines extend in a first direction, wherein each first conductive line connects to gate terminals of transistors arranged in same column in the array. The plurality of second conductive lines extend in the first direction, wherein each second conductive line connects to source terminals of transistors arranged in same column in the array. The plurality of third conductive lines extend in the first direction, wherein each third conductive line connects to drain terminals of transistors arranged in same column in the array. The plurality of fourth conductive line extend in a second direction, wherein each fourth conductive line couples to the capacitor arranged in same row in the array.

In some embodiments, a semiconductor device is disclosed. The semiconductor device includes a substrate, a plurality of gate strips, a plurality of ferroelectric material strips, a plurality of first conductive lines and a plurality of second conductive lines. The plurality of gate strips are formed on the substrate and extend in a first direction. The plurality of ferroelectric material strips are formed above the plurality of gate strips and extend in a second direction orthogonal with the first direction, wherein intersections of the gate strips and the ferroelectric material strips define an array of ferroelectric field effect transistor (FeFET). The plurality of first conductive lines extend in the first direction, wherein each first conducive line connects to one of the plurality of gate strips. The plurality of second conductive lines extend in the second direction, wherein each second conductive lines connects to one of the plurality of ferroelectric material strips.

In some embodiments, a method of manufacturing a semiconductor device is disclosed. The method includes: providing a substrate; forming a plurality of gate strips on the substrate, and the plurality of gate strip extend in a first direction; forming a plurality of ferroelectric material strips above the plurality of gate strips, and the plurality of ferroelectric material strips extend in a second direction orthogonal with the first direction, wherein intersections of the gate strips and the ferroelectric material strips define an array of ferroelectric field effect transistor (FeFET); forming a plurality of first conductive lines extending in the first direction, wherein each first conducive line connects to one of the plurality of gate strips; and forming a plurality of second conductive lines extending in the second direction, wherein each second conductive line connects to one of the plurality of ferroelectric material strips.

What is claimed is:

1. A memory device, comprising:
    a plurality of memory cells arranged in an array, wherein each memory cell includes a transistor and a capacitor connected to a gate terminal of the transistor in series;
    a plurality of first conductive lines, extending in a first direction, wherein each first conductive line connects to gate terminals of transistors arranged in same column in the array;
    a plurality of second conductive lines, extending in the first direction, wherein each second conductive line connects to source terminals of transistors arranged in same column in the array;
    a plurality of third conductive lines, extending in the first direction, wherein each third conductive line connects to drain terminals of transistors arranged in same column in the array; and
    a plurality of fourth conductive line, extending in a second direction, wherein each fourth conductive line couples to the capacitor arranged in same row in the array.

2. The memory device of claim 1, wherein when the memory device operates in a write operation upon one of the plurality of memory cells, a corresponding fourth conductive line is directed to an indicating voltage, and a corresponding first conductive line is directed to a data to be written in said one of the plurality of memory cells.

3. The memory device of claim 2, wherein when the memory device operates in the write operation upon said one of the plurality of memory cells, a corresponding second conductive line and a corresponding third conductive line are floating.

4. The memory device of claim 2, wherein the indicating voltage is smaller than three times a threshold voltage of the transistor.

5. The memory device of claim 1, wherein when the memory device operates in a read operation upon one of the plurality of memory cells, a corresponding fourth conductive line is directed to an indicating voltage, and a corresponding first conductive line is floating.

6. The memory device of claim 5, wherein when the memory device operates in the read operation upon said one of the plurality of memory cells, a corresponding second conductive line is directed to the data and a corresponding third conductive line is directed to a ground voltage.

7. The memory device of claim 1, wherein each memory cell further includes a mitigating device connected between the capacitor and a corresponding fourth line.

8. The memory device of claim 7, wherein the mitigating device includes a Shottky diode, a tunnel diode or a Metal-Insulator-Metal (MIM) capacitor.

9. A semiconductor device, comprising:
a substrate;
a plurality of gate strips formed on the substrate and extending in a first direction;
a plurality of ferroelectric material strips formed above the plurality of gate strips and extending in a second direction orthogonal with the first direction, wherein intersections of the gate strips and the ferroelectric material strips define an array of ferroelectric field effect transistor (FeFET);
a plurality of first conductive lines extending in the first direction, wherein each first conducive line connects to one of the plurality of gate strips;
a plurality of second conductive lines extending in the second direction, wherein each second conductive lines connects to one of the plurality of ferroelectric material strips;
a plurality of active regions configured to be source/drain regions of FeFETs;
a plurality of third conductive lines, extending in the first direction, wherein each third conductive line connects to source regions of FeFETs arranged in same column; and
a plurality of fourth conductive lines, extending in the first direction, wherein each fourth conductive line connects to drain regions of FeFETs arranged in same column.

10. The semiconductor device of claim 9, wherein when the semiconductor device operates in a write operation upon one of the FeFETs, a corresponding first conductive line is directed to a data to be written in said one of FeFETs, and a corresponding second conductive line is directed to an indicating voltage.

11. The semiconductor device of claim 10, wherein when the semiconductor device operates in the write operation upon said one of the FeFETs, a corresponding third conductive line and a corresponding fourth conductive line are floating.

12. The semiconductor device of claim 10, wherein the indicating voltage is smaller than three times a threshold voltage of said FeFET.

13. The semiconductor device of claim 10, wherein when the semiconductor device operates in a read operation upon said one of the FeFETs, a corresponding first conductive line is floating, and a corresponding second conductive line is directed to an indicating voltage.

14. The semiconductor device of claim 13, wherein when the semiconductor device operates in the read operation upon said one of the FeFETs, a corresponding third conductive line is coupled to a ground voltage and a corresponding fourth conductive line is directed to the data.

15. A method of manufacturing a semiconductor device, comprising:
providing a substrate;
forming a plurality of gate strips on the substrate, and the plurality of gate strip extend in a first direction;
forming a plurality of ferroelectric material strips above the plurality of gate strips, and the plurality of ferroelectric material strips extend in a second direction orthogonal with the first direction, wherein intersections of the gate strips and the ferroelectric material strips define an array of ferroelectric field effect transistor (FeFET);
forming a plurality of first conductive lines extending in the first direction, wherein each first conducive line connects to one of the plurality of gate strips;
forming a plurality of second conductive lines extending in the second direction, wherein each second conductive line connects to one of the plurality of ferroelectric material strips;
forming a plurality of active regions configured to be source/drain regions of FeFETs;
forming a plurality of third conductive lines extending in the first direction, wherein each third conductive line connects to source regions of FeFETs arranged in same column; and
forming a plurality of fourth conductive lines extending in the first direction, wherein each fourth conductive line connects to drain regions of FeFETs arranged in same column.

16. The method of claim 15, further comprising:
directing an indicating voltage to a corresponding second conductive line when the semiconductor device operates in a write operation upon one of the FeFETs; and
directing a data to be written in said one of the FeFETs to a corresponding first conductive line when the semiconductor device operates in the write operation upon said one of the FeFETs.

17. The method of claim 16, further comprising:
directing an indicating voltage to a corresponding second conductive line when the semiconductor device operates in a read operation upon said FeFET; and
floating a corresponding first conductive line when the semiconductor device operates in the read operation upon said FeFET.

18. The method of claim 16, wherein the indicating voltage is smaller than three times a threshold voltage of said FeFET.

19. The method of claim 16, further comprising:
floating a corresponding third conductive line and a corresponding fourth conductive line when the semiconductor device operates in the write operation upon said one of FeFETs.

20. The method of claim 17, further comprising:
coupling a corresponding third conductive line to a ground voltage when the semiconductor device operates in the read operation upon said one of FeFETs; and
directing a corresponding fourth conductive line to the data when the semiconductor device operates in the read operation upon said one of FeFETs.

* * * * *